United States Patent
Tate, Jr. et al.

(10) Patent No.: US 6,927,554 B2
(45) Date of Patent: Aug. 9, 2005

(54) SIMPLE OPTIMAL ESTIMATOR FOR PBA STATE OF CHARGE

(75) Inventors: Edward D. Tate, Jr., Grand Blanc, MI (US); Mark W. Verbrugge, Troy, MI (US)

(73) Assignee: General Motors Corporation, Detroit, MI (US)

( * ) Notice: Subject to any disclaimer, the term of this patent is extended or adjusted under 35 U.S.C. 154(b) by 0 days.

(21) Appl. No.: 10/650,933

(22) Filed: Aug. 28, 2003

(65) Prior Publication Data

US 2005/0046388 A1 Mar. 3, 2005

(51) Int. Cl.[7] .............................. H02J 7/00; G06F 19/00
(52) U.S. Cl. ........................................ 320/132; 702/64
(58) Field of Search .............................. 320/132, 149, 320/104; 702/64, 63; 324/427, 430, 433; 290/40 C, 1 B; 363/37; 340/870.05, 439; 704/64

(56) References Cited

U.S. PATENT DOCUMENTS

| | | | | |
|---|---|---|---|---|
| 4,193,026 A | * | 3/1980 | Finger et al. | 324/428 |
| 4,709,318 A | * | 11/1987 | Gephart et al. | 363/37 |
| 5,945,829 A | * | 8/1999 | Bertness | 324/430 |
| 6,239,502 B1 | * | 5/2001 | Grewe et al. | 290/1 B |
| 6,332,113 B1 | * | 12/2001 | Bertness | 702/63 |
| 6,359,419 B1 | | 3/2002 | Verbrugge et al. | 320/132 |
| 6,417,577 B1 | * | 7/2002 | Grewe et al. | 290/40 C |
| 6,441,585 B1 | * | 8/2002 | Bertness | 320/132 |
| 6,441,586 B1 | * | 8/2002 | Tate et al. | 320/132 |
| 6,639,385 B2 | * | 10/2003 | Verbrugge et al. | 320/132 |
| 6,653,817 B2 | * | 11/2003 | Tate et al. | 320/132 |
| 2002/0024221 A1 | * | 2/2002 | Grewe et al. | 290/40 C |
| 2002/0196027 A1 | * | 12/2002 | Tate et al. | 324/430 |
| 2003/0076109 A1 | * | 4/2003 | Verbrugge et al. | 324/427 |
| 2004/0162683 A1 | * | 8/2004 | Verbrugge et al. | 702/64 |

\* cited by examiner

*Primary Examiner*—Pia Tibbits
(74) *Attorney, Agent, or Firm*—Christopher DeVries

(57) ABSTRACT

A state of charge estimator for a battery includes a meter that generates a terminal voltage signal of the battery and a terminal current signal of the battery. A controller employs a linearized model of the battery and a time-varying state estimator. The controller process a synthesized input based on the terminal current and the terminal voltage to estimate the battery state of charge.

13 Claims, 4 Drawing Sheets

SIMPLE OPTIMAL ESTIMATOR FOR PBA STATE OF CHARGE

FIELD OF THE INVENTION

The present invention relates to power sources, and more particularly to a state of charge estimator for a lead-acid (PbA) power source.

BACKGROUND OF THE INVENTION

The state of charge (SOC) of a battery indicates the amount of usable energy stored within the battery at a given time. It is analogous to the amount of fuel in a fuel tank. In order to improve battery life and overall battery performance, the battery must be maintained at an optimal SOC. The state of health (SOH) of a battery indicates the condition of the battery. The SOH is based on observing particular battery parameters to determine the extent of unobservable, internal damage or degradation.

A battery can be considered a system that has current and heat flow as inputs and responses of voltage and temperature. The voltage response of the battery to current stimulation is described using a combination of voltages and a current source. These voltages include an equilibrium potential, voltage resulting from hysteresis effects, voltage resulting from ohmic resistance drops, and voltage resulting from dynamics in the battery, or double-layer voltage. Each of these voltages can be described by either an algebraic function, a differential equation or a convolution integral. The current source is indicative of a self-discharge current of the battery.

During use, battery resistance, equilibrium potential, voltage resulting from hysteresis effects, voltage resulting from ohmic resistance drops, double-layer voltage, and self-discharge current are not directly measurable. These values influence the SOC and the parameters that indicate the SOH of the battery. Because they are not directly measurable, it is often difficult to accurately determine the SOC and SOH of the battery. Therefore, it is difficult to maintain the battery at an optimal SOC or to determine when the SOH has degraded to a point where battery performance is significantly effected.

SUMMARY OF THE INVENTION

Accordingly, the present invention provides a state of charge estimator for a battery. The state of charge estimator includes a meter that generates a terminal voltage signal of the battery and a terminal current signal of the battery. A controller employs a linearized model of the battery and a time-varying state estimator. The controller processes a synthesized input based on the terminal current and the terminal voltage to estimate the battery state of charge.

In one feature, the battery system includes a generator that is controlled by the controller to selectively charge the battery based on the state of charge.

In another feature, the controller predicts a current state of charge based on a prior state of charge and predicts a current state of charge error based on a prior state of charge error. The controller determines a current gain based on the current state of charge error and updates the current state of charge based on the prior state of charge.

In another feature, the synthesized input compensates for gassing and self-discharging of the battery.

In still another feature, the synthesized input compensates for dynamic impedances and non-linear characteristics of the battery.

In yet another feature, the battery is a lead-acid battery.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
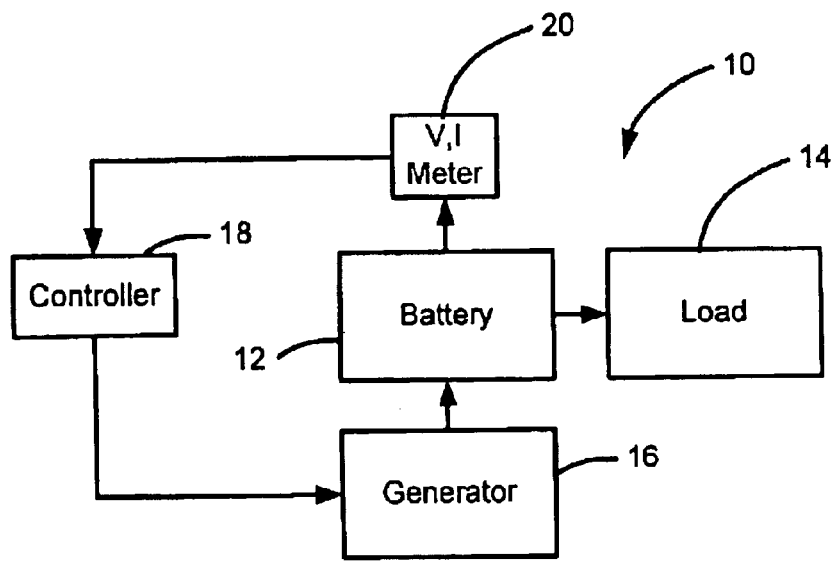
FIG. 1 is a functional block diagram of a system including a battery, a load powered by the battery and a generator to recharge the battery.

The following description of the preferred embodiment is merely exemplary in nature and is in no way intended to limit the invention, its application, or uses. For purposes of clarity, the same reference numbers will be used in the drawings to identify similar elements.

Referring now to FIG. 1, a system 10 includes a battery 12 that is discharged as it powers a load 14. The battery 12 is selectively recharged by a generator 16. Operation of the generator 16 is controlled by a controller 18. A meter 20 communicates with the battery 12 and generates a terminal voltage signal ($V_t$) and a terminal current signal ($I_t$). The controller 18 process the terminal voltage and terminal current signals according to the present invention to estimate a state of charge (SOC) of the battery 12. The controller 18 signals the generator 16 to operate based on the SOC estimate.

Although the system 10 is a generic battery system, it is indicative of a battery system implemented in a vehicle. In a vehicle, the battery 12 powers loads such as headlamps, heaters, power seats and windows, and the like. The vehicle's engine drives the generator 16 or alternator to produce recharging current.

Figure 2:
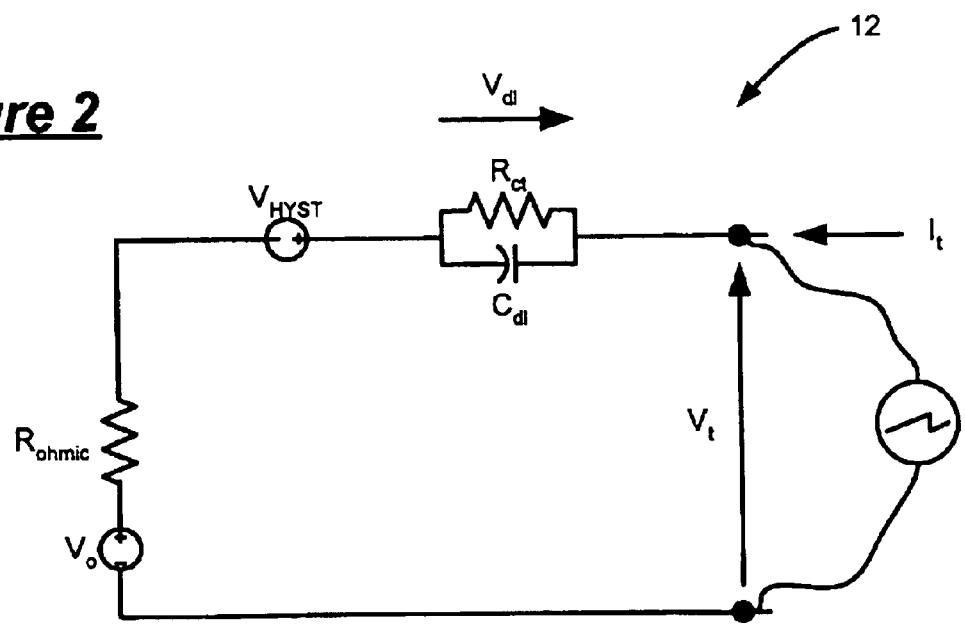
FIG. 2 is a schematic diagram of the battery.
Figure 3:
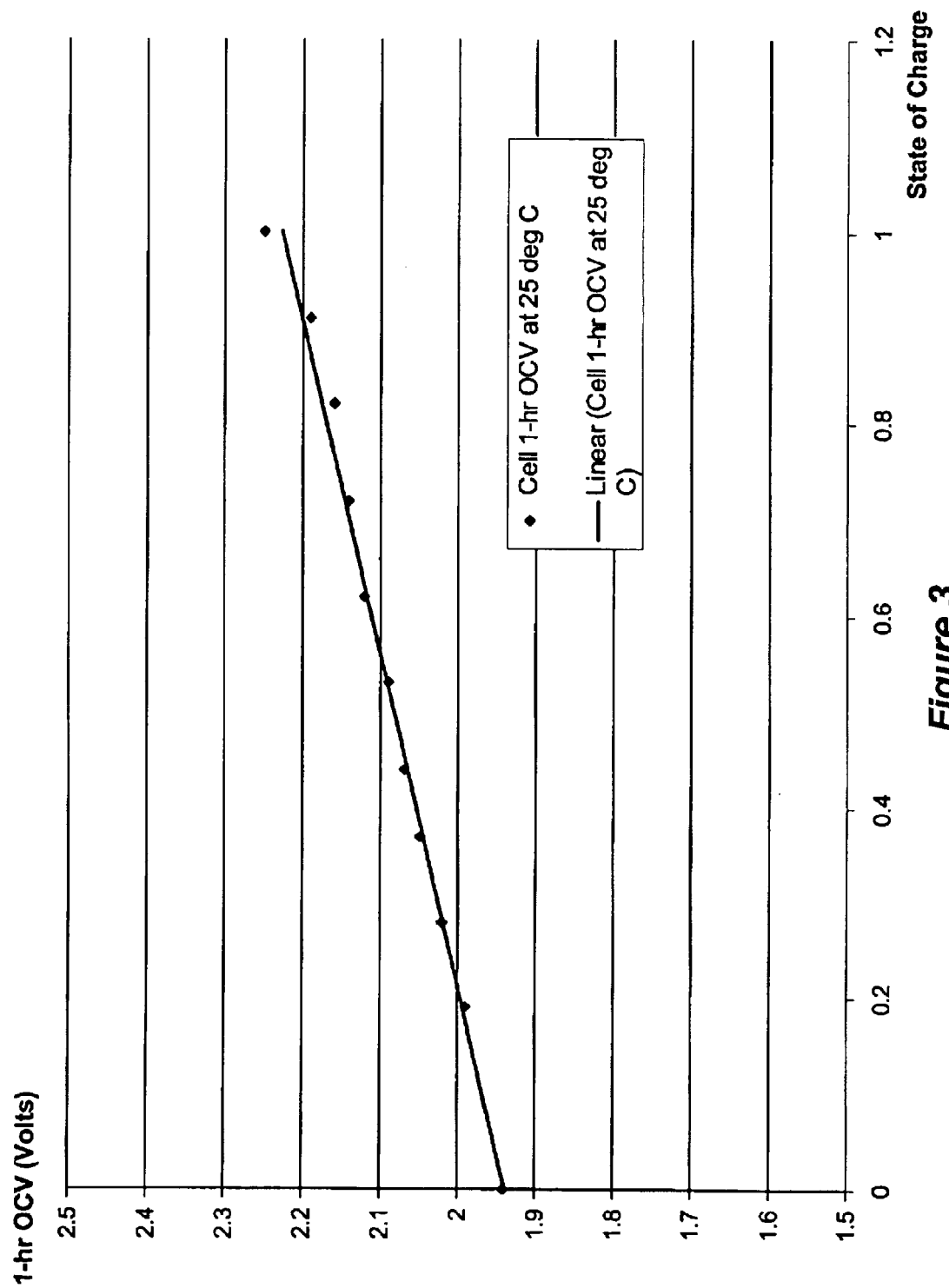
FIG. 3 is a graph of state of charge (SOC) based on open circuit voltage ($V_o$)

Referring now to FIG. 2, the battery 12 is schematically modeled in terms of an equilibrium potential ($V_o$), voltage resulting from hysteresis effects ($V_{hyst}$), voltage resulting from ohmic resistance drops ($V_{ohmic}$), voltage resulting from dynamics in the battery ($V_{dl}$), or double-layer voltage and, and a self-discharge current ($I_{SD}$). $V_o$ can be determined based on $V_{dl}$ and $V_{hyst}$. $V_{dl}$ and $V_{hyst}$ are determined using an open loop model. These voltages are subtracted from a measurable terminal voltage ($V_t$) to determine $V_o$. Knowing $V_o$ is sufficient to estimate the SOC of the battery 12 given a function that maps $V_o$ to SOC. An empirical fit of the SOC to $V_o$ for an exemplary lead-acid (PbA) battery is shown in FIG. 3. Although the battery model of FIG. 2 does not include all of the existing battery behaviors, testing and experience has shown that this battery model is sufficient for SOC estimation, power control and diagnostics for automotive applications.

The present invention provides a Kalman Filter (KF)-based state estimator to determine the SOC and resistance of the battery 12. A standard Kalman Filter (KF) combines the concept of recursive least squares estimation with a state space model and noise model to optimally estimate the state (x) of a system. The KF estimates the state of the system based on a linear model of the system. The linear model of the system includes a linear dynamic model, a description of the covariance of the errors in the system dynamics and a description of the covariance of the errors in system measurements. The linear model is expressed in state space form as:

$$x_{k+1} = A_k x_k + B_k u_k + w_k \text{ (Process Model); and}$$

$$y_k = F_k x_k + G_k u_k + r_k \text{ (Measurement Model)}$$

where:

$x_k$ is the state vector (i.e. what is to be estimated);

$y_k$ is the measurement vector (known);

$u_k$ is the deterministic input to the battery (known);

$w_k$ is the process noise (i.e. random inputs into the system);

$r_k$ is the measurement noise (i.e. random noise that affects measurements); and $A_k$, $B_k$, $F_k$, $G_k$ are the system matrices (known).

The KF estimates a state by using a form of feedback control. In short, the KF estimates the state at some time and then obtains feedback in the form of noisy measurements. The KF equations fall into two groups: time update equations (predictor) and measurement equations (corrector). The time update equations project the current state and error covariance estimates to obtain estimates for the next time step. The measurement update equations incorporate new measurements into the estimates to obtain an improved estimate.

The KF-based state estimator of the present invention introduces a mechanism that propagates the state estimate based on battery dynamics and propagates the estimate error covariance based on battery dynamics and knowledge of how noise affects the battery. The battery is a non-linear system. However, the KF-based state estimator simplifies the system by either linearizing non-linearities or removing them. Further, the KF-based state estimator accounts for time varying parameters to more quickly improve estimate errors. The controller processes the KF-based state estimator and controls other components of the system in response to the state estimates.

The state estimates include SOC and internal (ohmic) resistance ($R_{ohmic}$). The KF-based state estimator propagates (predicts) the estimated state value ($x_k$) and the covariance of the estimate error forward in time to the next measurement. The next measurement is obtained and the KF-based state estimator updates (corrects) $x_k$ based on the measurement. The covariance of the estimate error (P) is updated based on the measurement. As discussed in detail below, the order of these operations can vary.

The process model of the KF-based state estimator describes how the internal states of the battery 12 change in response to current. The process model is provided as:

$$x_{k+1} = A x_k + B u'_k = w_k$$

where:

$$x = \begin{bmatrix} V_{OC} \\ R_{ohmic} \end{bmatrix}$$

$$A = \begin{bmatrix} 1 & 0 \\ 0 & 1 \end{bmatrix} \text{ (identity matrix); and}$$

$$B = \begin{bmatrix} \eta_{CE}(Q_{SOC}, I_t) & 0 & -1 \\ 0 & 0 & 0 \end{bmatrix} \cdot \frac{1}{3600}$$

(establishes relationship between SOC and current using charge efficiency ($\eta_{CE}$)). Expanding this vector equation, the following $V_{OC}$ and $R_{ohmic}$ process models are provided:

$$[V_{OC}]_{k+1} = [V_{OC}]_k + Bu'_k + w_k$$

$$[R_{ohmic}]_{k+1} = [R_{ohmic}]_k + Bu'_k + w_k$$

The measurement model of the KF-based state estimator describes how the states and the input current appear as a voltage across the terminals of the battery 12. The measurement model is provided as:

$$y'_k = F_k x_k + r_k$$

where:

$$F_k = \lfloor 1 \quad I_{scaled,k} \rfloor$$

Expanding this vector equation, the following measurement model is provided:

$$y'_k = V_{OC} + R_{ohmic} I_{scaled,k} + r_k$$

At time k, the terminal voltage ($V_t$) and terminal current ($I_t$) of the battery 12 are measured using the meter 20. These measurements are provided as:

$$y_k = V_{t,k}$$

$$u_k = I_{t,k}$$

To include the effects of dynamics resulting from $V_{dl}$ and $V_{hyst}$ auxiliary relationships are implemented. Implementation of the auxiliary relationships enables the KF-based algorithm to be of a much lower order than would be typical. In this way, a more simple state estimator is provided. The dynamics are accounted for based on $V_{t,k}$ and $I_{t,k}$ according to the following auxiliary relationships:

$$V_{dl,k+1} = f(V_{dl,k}, I_{t,k}, I_{SD,k})$$

$$V_{hyst,k+1} = f(V_{hyst,k}, I_{t,k}, I_{SD,k})$$

$$I_{SD} = f(Q_{SOC,k}, T_k)$$

$$I_{scaled} = f(I)$$

Compensated voltage (y') and current (u') values are determined based on $V_{t,k}$ and $I_{t,k}$ and the dynamics according to the following:

$$y'_k = [V_{t,k} - V_o V_{dl,k} - V_{hyst,k}]$$

$$u'_k = \begin{bmatrix} I_{t,k} \\ I_{scaled} \\ I_{sd} \end{bmatrix}$$

$V_o$ is the open-circuit voltage or battery voltage at 0% SOC.

Applying the compensated current value ($u'_k$) to the $V_{OC}$ and $R_{ohmic}$ process models provides:

$$[V_{OC}]_{k+1}=[V_{OC}]_k+[I_{t,k}\eta_{CE}(Q_{SOC},I_t)-I_{SD}]/3600+w_k$$

$$[R_{ohmic}]_{k+1}=[R_{ohmic}]_k+w_k$$

Applying the compensated voltage value ($y'_k$) to the measurement model provides:

$$V_{t,k}-V_o-V_{dl,k}-V_{hyst,k}=V_{OC}+R_{ohmic}I_{scaled,k}+r_k$$

where:
$r_k$ is the sum of all of the noises in the system.
System noises include those associated with quantitization and A/D converter accuracy, those associated with the auxiliary equations and those associated with modeling errors between the states and measurements.

The estimated state values ($Q_{SOC}$, $R_{ohmic}$) are propagated according to the following equation:

$$x_{k|k-1}=Ax_{k-1|k-1}+Bu'_k \text{ (Process Propagation Model)}$$

The notation k|k−1 indicates the estimate of the value at time k given the information available at time k−1. The Process Propagation Model (PPM) is based on the Process Model (PM) above. The process noise ($w_k$) drops out because only propagation of the mean is desired. The process noise ($w_k$) is randomly generated with a mean value of zero.

An initial value for the battery states ($Q_{SOC}$, $R_{ohmic}$) are pre-programmed in memory. Certain assumptions are required to determine the initial value. It is appreciated that these assumptions can vary based on the characteristics of battery. Exemplary assumptions include the battery SOC= 50% fro SOC initialization. If a 55 amp-hr battery is assumed, the nominal battery charge is equal to 27.5 amp-hrs. If it is assumed that the battery 12 has an equal probability of having any charge within 15 amp-hrs of the 27.5 amp-hrs, then the variance is roughly 20(amp-hrs)$^2$. The nominal resistance is assumed to be 3 mohms. If it is assumed that the resistance has an equal probability of having any resistance within 1.5 mohms of 3 mohms then the variance is 0.8(mohms$^2$). The assumptions are selected to minimize the error between the actual states and the assumed states to enable quicker error reduction.

Assumptions are also required for the measurement and process noises. With regard to the measurement noise, there are four sources of noise in the measurement model: 1) the terminal voltage measurement, 2) the terminal current measurement, 3) the auxiliary equations, and 4) the measurement equation. Ignoring auxiliary equation and measurement equation noises, the terminal measurement variance (R) is estimated as 5 (mV)$^2$/cell. With regard to the process noise, values are chosen to achieve a desired behavior in terms of convergence to steady state and steady state blending of process model vs. measurement model corrections. Thus, process model noise values (Q) were chosen as $5e^{-5}$(amp-hr)$^2$ and $6e^{-9}$ (ohms)$^2$/cell. This provides the following matrices:

$$R=[0.005]$$

$$Q = \begin{bmatrix} 5 \cdot 10^{-5} & 0 \\ 0 & 6 \cdot 10^{-9} \end{bmatrix}$$

It is appreciated that the initial values and assumptions described herein are merely exemplary in nature. The initial values and assumptions may vary based on the particular characteristics of the battery 12.

A Kalman gain matrix (K) is calculated according to the following equation:

$$K_k=P_{k|k-1}F_k^t(F_kP_{k|k-1}F_k^t+R)^{-1}$$

where:

$$F = \lfloor 1 \quad I_{t,k} \rfloor$$

(varies with time); and
R is the measurement noise covariance (known).
The covariance of the estimate error is propagated according to the following equation:

$$P_{k|k-1}=AP_{k-1|k-1}A^t+Q \text{ (Error Propagation Model)}$$

where:
$A^t$ is (known); and
Q is the process noise covariance matrix (known).
The Error Propagation Model (EPM) predicts the error covariance for the state estimate.

The estimated state value ($x_k$) is corrected according to the following equation:

$$x_{k|k}=x_{k|k-1}+K_k(y'_k-F_kx_{k|k-1})$$

The covariance of the estimated error (P) is corrected according to the following equation:

$$P_{k|k}=(P_{k|k-1}^{-1}+F_k^tR^{-1}F_k)^{-1}$$

In the interest of reducing the amount of computing power and time required to process the KF-based state estimator, the KF-based state estimator can be simplified. In particular, the A-matrix is eliminated to simplify the propagation of the state estimate and the propagation of the estimate error covariance. This provides the following simplified equations:

$$x_{k|k-1}=x_{k-1|k-1}+Bu'_k \text{ (simplified PPM)}$$

$$P_{k|k-1}=P_{k-1|k-1}+Q \text{ (Simplified EPM)}$$

The Kalman gain equation is simplified to eliminate the need for matrix inversion. This provides the following simplified equation:

$$K_k=P_{k|k-1}F_k^t(F_kP_{k|k-1}F_k^t+R)^{-1}$$

The error covariance update equation is also simplified, providing the following:

$$P_{k|k}=(I-K_kF_k)P_{k|k-1}$$

Figure 4:
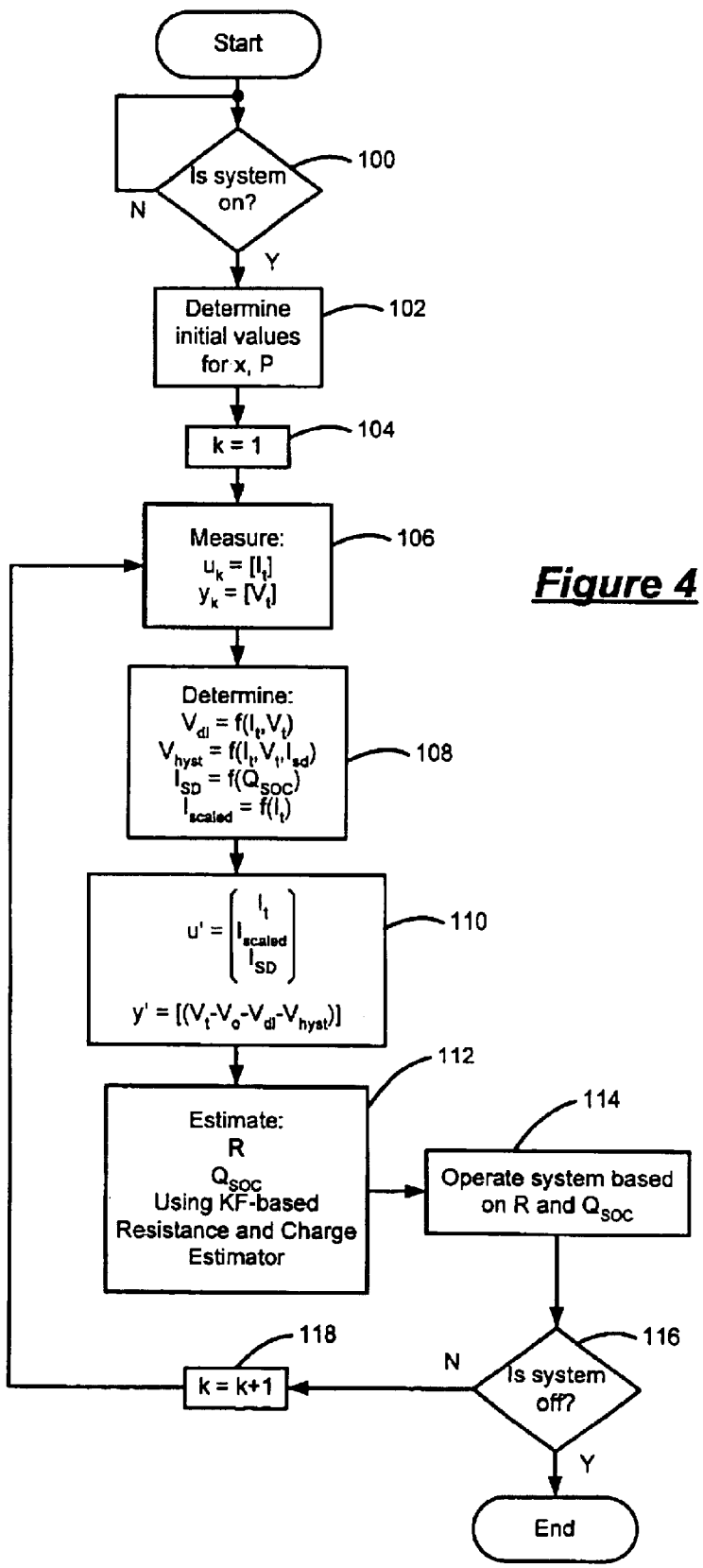
FIG. 4 is a flowchart illustrating the state of charge estimator control according to the present invention.

Referring now to FIG. 4, the state estimator control will be described in detail. In step 100, control determines whether the system 10 is on. If so, control continues with step 102. If not, control loops back. In step 102 control determines initial state values ($X_{0|0}$) and initial error covariance values ($P_{0|0}$). Selection of these values is described above. In step 104, control sets a counter, k equal to 1.

In step 106, control measures the terminal voltage and terminal current by receiving signals from the meter 20. In step 108, control determines the dynamic factors using the auxiliary relationships. In step 110, control determines the compensated input matrices. In step 112, control processes the KF-based state estimator to estimate the present SOC and resistance of the battery 12. Control processes the KF-based state estimator using the compensated input matrices.

In step 114, control operates the system 10 based on the estimated SOC and resistance. Operation of the system 10 can include battery charging, power control or system diagnostics. It is appreciated, however, that other operations can be included over those presently described. In step 116, control determines whether the system 10 is off. If not, control continues with step 118. If so, control ends. In step 118, control increments the counter by 1 then loops back to step 106.

Figure 5:
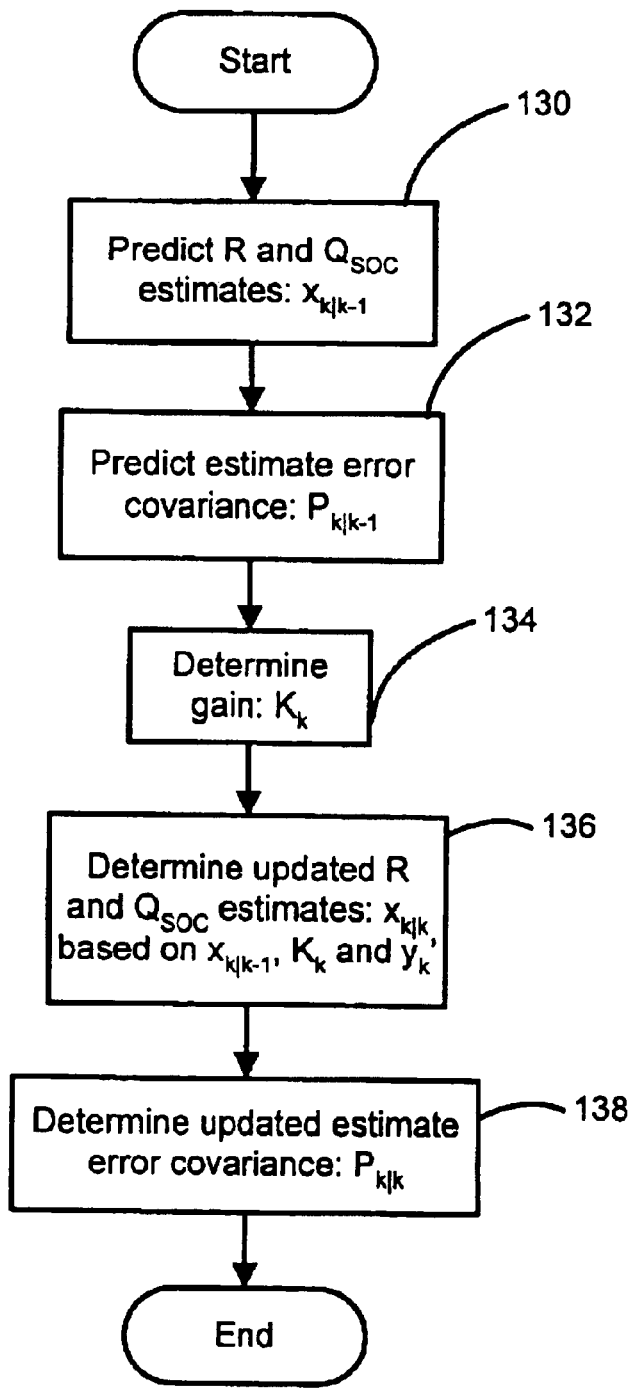
FIG. 5 is a flowchart illustrating estimation control for the state of charge estimator control of FIG. 4.

Referring now to FIG. 5, the estimation control will be described in detail. The estimation control occurs within step 112 of FIG. 4. In step 130, control predicts the current state estimates based on prior information ($x_{k|k-1}$). In step 132, control predicts the current estimate error covariance based on prior information ($P_{k|k-1}$). In step 134, control determines the current Kalman gain ($K_k$). In step 136, control updates the current state estimates ($x_{k|k}$) based on $x_{k|k-1}$, $K_k$ and $y_k'$. In step 138, control updates the estimate error covariance ($P_{k|k-1}$) to be used in the next iteration then control ends.

The KF-based state estimator can operate using either backward rectangular integration, forward rectangular integration or trapezoidal integration. In order to design the KF-based state estimator to operate using backward or forward integration, the prediction and correction operations change order. For example, for backward rectangular integration, the prediction equations are processed first and the correction equations second. For forward rectangular integration, the correction equations are processed first and the prediction equations second.

To enable trapezoidal integration the simplified PPM and the B-matrix are modified. In particular, the simplified PPM uses an average value of the compensated current values ($u_k'$). This provides the following modified PPM equation:

$$x_{k|k-1} = x_{k-1|k-1} + B[(u_k' + u_k')/2]$$

The B-matrix is provided as:

$$B = \begin{bmatrix} \frac{\eta_{CE}(Q_{SOC,k}, I_{t,k})}{2} & 0 & -0.5 & \frac{\eta_{CE}(Q_{SOC,k-1}, I_{t,k-1})}{2} \\ 0 & 0 & 0 & 0 \end{bmatrix} \cdot \frac{1}{3600}$$

The KF-based state estimator of the present invention provides the simplest state estimator for a dynamic system. The simplicity of the KF-based state estimator enables practical implementation in applications, such as automotive applications, because of the reduced amount of processing power and time required. The KF-based state estimator accounts for system dynamics and provides a linearized model of a non-linear system.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A method of estimating a state of charge of a battery, comprising:
   modeling battery measured variables of said battery with a linear equation;
   measuring a terminal current of said battery;
   measuring a terminal voltage of said battery; and
   processing said linear equation through a time-varying state estimator based on said terminal current and said terminal voltage to determine said state of charge.

2. The method of claim 1 wherein said linear equation is a process model that models changes in said state of charge based on current.

3. The method of claim 1 further comprising determining a compensated input wherein said processing is further based on said compensated input.

4. The method of claim 1 wherein said step of processing said linear equation comprises:
   predicting a current state of charge based on a prior state of charge;
   predicting a current state of charge error based on a prior state of charge error;
   determining a current gain based on said current state of charge error; and
   updating said current state of charge based on said prior state of charge to provide said state of charge of said battery.

5. The method of claim 4 wherein said state of charge error is continuously updated.

6. The method of claim 1 wherein said battery is a lead-acid battery.

7. A method of estimating a state of charge of a battery, comprising:
   modeling battery measured variables of said battery based o a linear process equation;
   determining a compensated input based on a terminal current of said battery and a terminal voltage of said battery; and
   processing a time-varying filter based on said process equation and said compensated input.

8. The method of claim 7 wherein said step of processing a time-varying filter comprises:
   predicting a current state of charge based on a prior state of charge;
   predict a current state of charge error based on a prior state of charge error;
   determining a current gain based on said current state of charge error; and
   updating said current state of charge based on said prior state of charge to provide said state of charge of said battery.

9. The method of claim 8 further comprising determining an initial value of said state of charge wherein said initial value is used as said prior state of charge to initially predict said current state of charge.

10. The method of claim 7 wherein said compensated input compensates for gassing and self-discharging of said battery.

11. The method of claim 7 wherein said compensated input compensates for dynamic impedances and non-linear characteristics of said battery.

12. The method of claim 7 further comprising modeling non-linear dynamic voltage characteristics of said battery wherein said step of processing is further based on said dynamic voltage characteristics.

13. The method of claim 7 wherein said battery is a lead-acid battery.

* * * * *